United States Patent
Larrey et al.

(10) Patent No.: US 12,417,942 B2
(45) Date of Patent: Sep. 16, 2025

(54) PROCESS FOR HYDROPHILICALLY BONDING SUBSTRATES

(71) Applicants: COMMISSARIAT À L'ÉNERGIE ATOMIQUE ET AUX ÉNERGIES ALTERNATIVES, Paris (FR); Soitec, Bernin (FR)

(72) Inventors: Vincent Larrey, Grenoble (FR); François Rieutord, Grenoble (FR); Jean-Michel Hartmann, Grenoble (FR); Frank Fournel, Grenoble (FR); Didier Landru, Le Champ-près-Froges (FR); Oleg Kononchuk, Theys (FR); Ludovic Ecarnot, Grenoble (FR)

(73) Assignees: COMMISSARIAT À L'ENERGIE ATOMIQUE ET AUX ÉNERGIES ALTERNATIVES, Paris (FR); Soitec, Bernin (FR)

( * ) Notice: Subject to any disclaimer, the term of this patent is extended or adjusted under 35 U.S.C. 154(b) by 573 days.

(21) Appl. No.: 17/597,583

(22) PCT Filed: Jul. 13, 2020

(86) PCT No.: PCT/FR2020/051260
§ 371 (c)(1),
(2) Date: Jan. 12, 2022

(87) PCT Pub. No.: WO2021/009459
PCT Pub. Date: Jan. 21, 2021

(65) Prior Publication Data
US 2022/0319910 A1 Oct. 6, 2022

(30) Foreign Application Priority Data
Jul. 15, 2019 (FR) .................... 1907964

(51) Int. Cl.
*H01L 21/762* (2006.01)
*H01L 21/02* (2006.01)

(52) U.S. Cl.
CPC .. *H01L 21/76254* (2013.01); *H01L 21/02164* (2013.01); *H01L 21/02211* (2013.01); *H01L 21/02323* (2013.01); *H01L 21/76243* (2013.01)

(58) Field of Classification Search
CPC .......... H01L 29/1604; H01L 21/76243; H01L 21/02323; H01L 21/02211;
(Continued)

(56) References Cited

U.S. PATENT DOCUMENTS

2002/0190269 A1* 12/2002 Atwater, Jr. ........ H01L 31/1852
438/933
2008/0153313 A1 6/2008 Kononchuk
(Continued)

FOREIGN PATENT DOCUMENTS

FR 2810448 B1 9/2003
JP 02-046722 A 2/1990
(Continued)

OTHER PUBLICATIONS

English Translation with paragraph numbers of for JP2011249780 Yokoi (Year: 2011).*
(Continued)

*Primary Examiner* — Julio J Maldonado
*Assistant Examiner* — Nathan Pridemore
(74) *Attorney, Agent, or Firm* — TraskBritt

(57) ABSTRACT

A process for hydrophilic bonding first and second substrates, comprising: —bringing the first and second substrates into contact to form a bonding interface between main surfaces of the first and second substrates, and— applying a heat treatment to close the bonding interface. The
(Continued)

process further comprises, before the step of bringing into contact, depositing, on the main surface of the first and/or second substrate, a bonding layer comprising a non-metallic material that is permeable to dihydrogen and that has, at the temperature of the heat treatment, a yield strength lower than that of at least one of the materials of the first substrate and of the second substrate located at the bonding interface. The layer has a thickness between 1 and 6 nm, and the heat treatment is carried out at a temperature lower than or equal to 900° C., and preferably lower than or equal to 600° C.

15 Claims, 7 Drawing Sheets

(58) Field of Classification Search
CPC ......... H01L 21/02164; H01L 21/76254; H01L 21/7624; H01L 76251
See application file for complete search history.

(56) References Cited

U.S. PATENT DOCUMENTS

2008/0169024 A1* 7/2008 Lee ................. H01L 31/022425
136/261

2014/0073112 A1* 3/2014 Plach ................. H01L 21/2007
438/455
2017/0178950 A1* 6/2017 Batude ............. H01L 21/02532

FOREIGN PATENT DOCUMENTS

JP      06-069087 A       3/1994
JP      2011249780 A  *   3/2014

OTHER PUBLICATIONS

Fujino et al., Silicon Wafer Direct Bonding Through the Amorphous Layer, Jpn. J. Appl. Phys., vol. 34, (1995), pp. L1322-L1324.
International Search Report for International Application No. PCT/FR2020/051260 dated Dec. 13, 2020, 2 pages.
International Written Opinion for International Application No. PCT/FR2020/051260 dated Dec. 13, 2020, 6 pages.
Vincent et al., A Model of Interface Defect Formation in Silicon Wafer Bonding, Applied Physics Letters, vol. 94, (2009), pp. 101914-1-101914-3.
Chinese First Office Action for Application No. 202080050959.X dated Oct. 26, 2024, 9 pages with English translation.

* cited by examiner

PROCESS FOR HYDROPHILICALLY BONDING SUBSTRATES

CROSS-REFERENCE TO RELATED APPLICATIONS

This application is a national phase entry under 35 U.S.C. § 371 of International Patent Application PCT/FR2020/051260, filed Jul. 13, 2020, designating the United States of America and published as International Patent Publication WO 2021/009459 A1 on Jan. 21, 2021, which claims the benefit under Article 8 of the Patent Cooperation Treaty to French Patent Application Serial No. FR1907964, filed Jul. 15, 2019.

TECHNICAL FIELD

The present disclosure relates to a process for hydrophilic bonding of substrates for applications in microelectronics, optoelectronics or optics.

BACKGROUND

It is known to bond substrates, especially semiconductor substrates, in order to form structures suitable for forming devices for microelectronics, optoelectronics or optics.

For example, semiconductor-on-insulator structures comprise, in succession, a carrier substrate, an electrically insulating layer and a thin semiconductor layer, called the active layer. When the active layer is made of silicon, the structure is said to be a silicon-on-insulator (SOI) structure. The electrically insulating layer is generally a silicon-oxide layer and is often said to be a buried oxide or BOX (Buried OXide) layer.

One particularly advantageous process for forming such structures is the Smart Cut™ process. This process typically comprises the following steps:
  providing the carrier substrate;
  providing a silicon donor substrate covered with a silicon-oxide layer formed by thermal oxidation;
  implanting ionic species, such as hydrogen and/or helium, into the donor substrate through the silicon-oxide layer, so as to form a weakened region delineating the thin layer to be transferred;
  bonding the donor substrate to the carrier substrate, the silicon-oxide layer being located at the bonding interface;
  splitting the donor substrate along the weakened region and detaching the remainder of the donor substrate so as to transfer the thin silicon layer to the donor substrate.

Preferably, the bonding is hydrophilic, i.e., the adhesion between the donor substrate and the carrier substrate is achieved via water molecules present at the bonding interface. The water is subsequently removed by implementing a heat treatment.

To ensure a high-quality bond, the surfaces that make contact of the carrier substrate and of the donor substrate must have a very low roughness. Before the bonding, the substrates therefore generally undergo a treatment aiming to obtain the desired roughness.

However, even if the surfaces have a suitable roughness, because of the high hardness and stiffness of the substrates, contact thereof will always be via a few asperities.

As may be seen in the left-hand part of FIG. 1, the asperities present on the surface of the substrates S1 and S2 engender cavities C at the interface between the two substrates; the bonding interface is therefore not completely closed. However, when a high-temperature heat treatment is applied, the contact surface grows until the asperities are flattened, this leading to removal of the cavities; the bonding interface I is then closed (right-hand part of FIG. 1).

FIG. 2 is a cross-sectional, high-resolution-transmission-electron-microscope (HRTEM) micrograph of a bonding interface I between a layer of silicon oxide ($SiO_2$) and a substrate of silicon (Si) at the end of such a heat treatment. The interface I is continuous and exhibits no cavities, so that it is perfectly closed.

However, such a closure of the bonding interface can be obtained only at the price of a high thermal budget. Thus, for bonding between two layers of thermal oxide, the temperature to be applied is at least 1200° C. for several hours. For bonding between a layer of thermal oxide and a silicon substrate (potentially covered with a native oxide), the temperature to be applied is 1100° C. for 2 hours; this temperature may be decreased to 1050° C. for 2 hours when a plasma treatment is applied beforehand to the oxide layer.

Such high-temperature heat treatments are generally very expensive because semiconductors are very easily damaged at high temperature. They must therefore be carried out with slow temperature ramps in order to avoid the risk of deformation of the substrates, this leading to long treatment times, or else under extremely controlled heating conditions, this requiring complex pieces of equipment. Moreover, the heat treatment for closing the bonding interface is generally the only step of the process for fabricating the structure that requires such a high temperature.

It would therefore be desirable to minimize the temperature of the heat treatment for closing the interface, while nonetheless guaranteeing closure of this interface.

Specifically, a defect in the closure of the interface may be extremely detrimental to the integrity and to the performance of the bonded structure.

A first consequence of imperfect closure of the interface is localized debonding, especially on the edges of the bonded structure. Regions that debond on the edge of the wafers redeposit locally on the surface of the substrate, creating regions that are unsuitable for the subsequent fabrication of electronic devices. These defects are referred to as flakes. FIG. 3 thus shows an image of a view from above of the location, on an SOI structure, of defects associated with incomplete closure of the bonding interface, the defects being identified by black dots. The three inserts located on the left-hand part of FIG. 3 are scanning-electron-microscope (SEM) micrographs of three flake-type defects F of different shapes and sizes.

A second consequence of imperfect closure of the interface is that the cavities present at the interface, especially on the edges of the structure, are regions liable to be preferentially etched by a chemical etchant. Specifically, the etchant is able to infiltrate the interface via these cavities and preferentially etch the materials present at the interface. FIG. 4 thus shows a cross-sectional view of an interface between two layers of silicon oxide ($SiO_2$ (1), $SiO_2$ (2)) each belonging to one substrate S1, S2. The right-hand image is an enlarged view of the left-hand image. In these images, the lighter region at the interface I corresponds to silicon oxide that has been etched.

The addition of metal layers (for example, of copper or tungsten) to the bonding interface or indeed of polymer deposits allows low interface-closing temperatures, typically below 500° C., to be achieved. However, metals, since they are electrically conductive or generate impurities in semiconductor substrates, are incompatible with a high number of microelectronic applications. Moreover, polymers are unstable at circuit fabrication temperatures.

Moreover, non-hydrophilic bonding techniques, for example, ultra-high vacuum bonding, do exist, the substrate surface that make contact being mechanically activated beforehand by ion bombardment. The closure of the interface in this case occurs at room temperature. This technique is called surface activated bonding (SAB). However, this technique is incompatible with the presence of an oxide at the bonding interface.

BRIEF SUMMARY

One aim of the present disclosure is therefore to design a process for hydrophilic bonding of two substrates in which the bonding interface is closed by way of a heat treatment at lower temperature than in existing processes.

To this end, the present disclosure provides a process for hydrophilic bonding of a first substrate onto a second substrate, comprising:
  bringing the first substrate and the second substrate into contact, so as to form a bonding interface between a main surface of the first substrate and a main surface of the second substrate,
  applying a heat treatment suitable for closing the bonding interface,
  the process being characterized in that it comprises, before the step of bringing into contact, depositing, on the main surface of the first and/or second substrate, a bonding layer made of a non-metallic material that is permeable to dihydrogen and that has, at the temperature of the heat treatment, a yield strength (or yield stress) lower than that of at least one of the materials of the first substrate and of the second substrate located at the bonding interface, the layer having a thickness between 1 and 6 nm.

Moreover, the bonding heat treatment is carried out at a temperature lower than or equal to 900° C., and preferably lower than or equal to 600° C.

Yield strength is the stress at which a ductile material in question begins to deform plastically. Yield strength is a well-known property of materials and its variation as a function of temperature is determinable; hence a comparison of the yield strength of two materials at a given temperature is within the ability of those skilled in the art.

Thus, for example, at a temperature of about 900° C., amorphous silicon has a yield strength lower than that of crystalline silicon or polysilicon (generally covered with a native oxide) and of silicon oxide. The same goes for amorphous germanium.

The yield strength quantifies the ability of the materials present at the bonding interface to deform plastically at the temperature at which the heat treatment is implemented.

The bonding layer is therefore more able to conform to the main surface of the opposite substrate so as to close the interface, and to do so at a lower temperature.

Moreover, this very thin bonding layer is compatible with the chemical process of hydrophilic bonding. Specifically, the layer is sufficiently porous to allow the dihydrogen produced by the reaction of the water with the silicon of the second substrate to pass to the silicon-oxide layer, this avoiding the defect-related problems encountered during silicon-to-silicon bonding.

According to other advantageous features, considered alone or in combination when this is technically appropriate:
  the first and second substrates are semiconductor substrates;
  the first substrate comprises a silicon-oxide surface layer other than a native oxide, and the bonding layer is deposited on the silicon-oxide layer;
  the silicon-oxide surface layer is formed by thermal oxidation of the first substrate;
  the second substrate comprises a silicon-oxide surface layer other than a native oxide, and a bonding layer is also deposited on the silicon-oxide layer;
  after the application of the heat treatment for closing the bonding interface, the process comprises a step of thinning the first substrate so as to transfer a thin silicon layer of the first substrate to the second substrate;
  between the deposition of the bonding layer and bringing the first substrate and the second substrate into contact, the process comprises forming a silicon-oxide surface layer on the first substrate and implanting ionic species in the first substrate through the silicon-oxide layer so as to form a weakened region delineating the semiconductor layer to be transferred;
  between the deposition of the bonding layer and bringing the first and second substrates into contact, the process comprises implementing a hydrophilic treatment of the main surface of the substrates and applying water to the main surface of the substrates in order to form a film of water on the main surface;
  before the deposition of the bonding layer, the process comprises a step of cleaning the main surface on which the layer must be deposited with an oxidizing solution;
  the second substrate is a silicon substrate, the substrate being covered with a layer of native silicon oxide;
  during the implementation of the heat treatment for closing the bonding interface, the process comprises oxidizing a surface segment of the silicon of the second substrate through the layer of native oxide;
  the material of the bonding layer is chosen from: amorphous silicon and amorphous germanium;
  the material of the bonding layer is amorphous silicon and the amorphous-silicon layer is formed in an epitaxial reactor at a temperature below 550° C.;
  the amorphous-silicon layer is formed from a precursor chosen from: disilane ($Si_2H_6$), silane ($SiH_4$) or a liquid precursor of formula $Si_nH_{2n+2}$, where n is an integer higher than 2;
  during the implementation of the heat treatment for closing the bonding interface, the process comprises oxidizing at least one portion of the bonding layer;
  the thickness of the bonding layer is chosen so that the entirety of the layer is oxidized during the heat treatment for closing the bonding interface.

BRIEF DESCRIPTION OF THE DRAWINGS

Other features and advantages of the present disclosure will emerge from the detailed description that follows, with reference to the accompanying drawings, in which.

For the sake of legibility of the figures, the thicknesses of the various layers illustrated have not necessarily been shown to scale.

DETAILED DESCRIPTION

General Presentation of the Process

Figure 1:
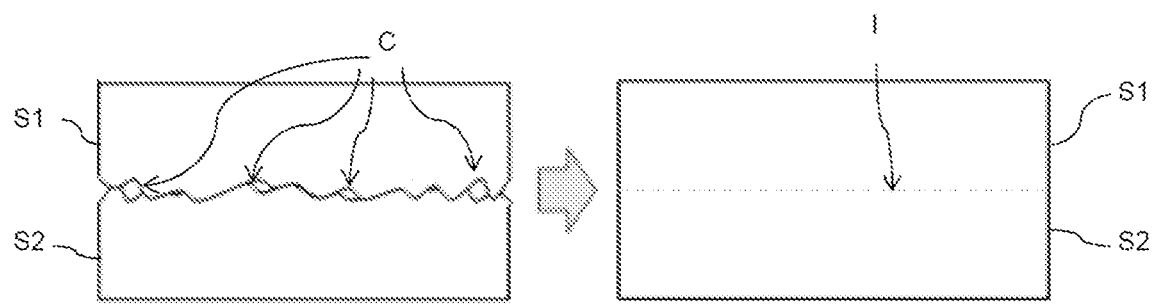
FIG. 1 schematically illustrates the closure of a bonding interface.
Figure 2:
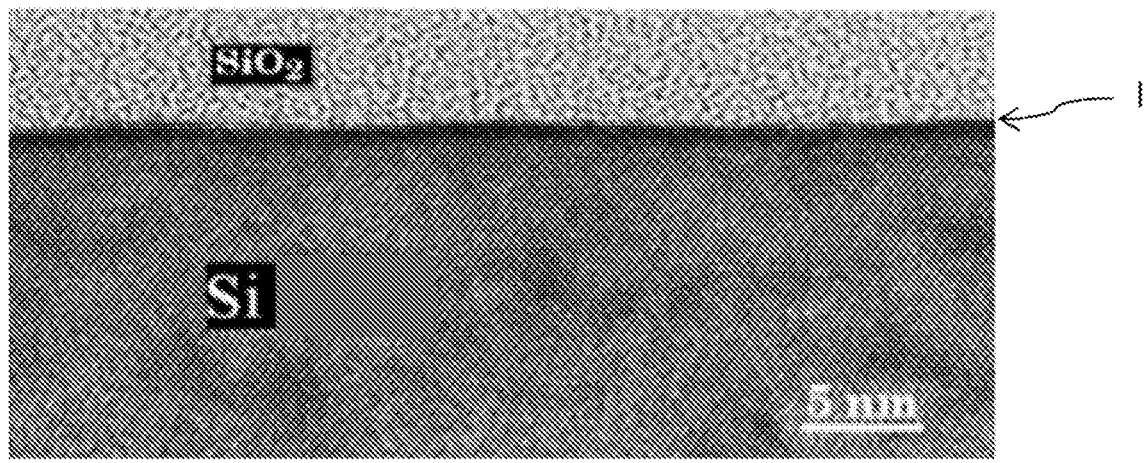
FIG. 2 is a cross-sectional, high-resolution-transmission-electron-microscope (HRTEM) micrograph of a completely closed bonding interface between silicon oxide and silicon.
Figure 3:
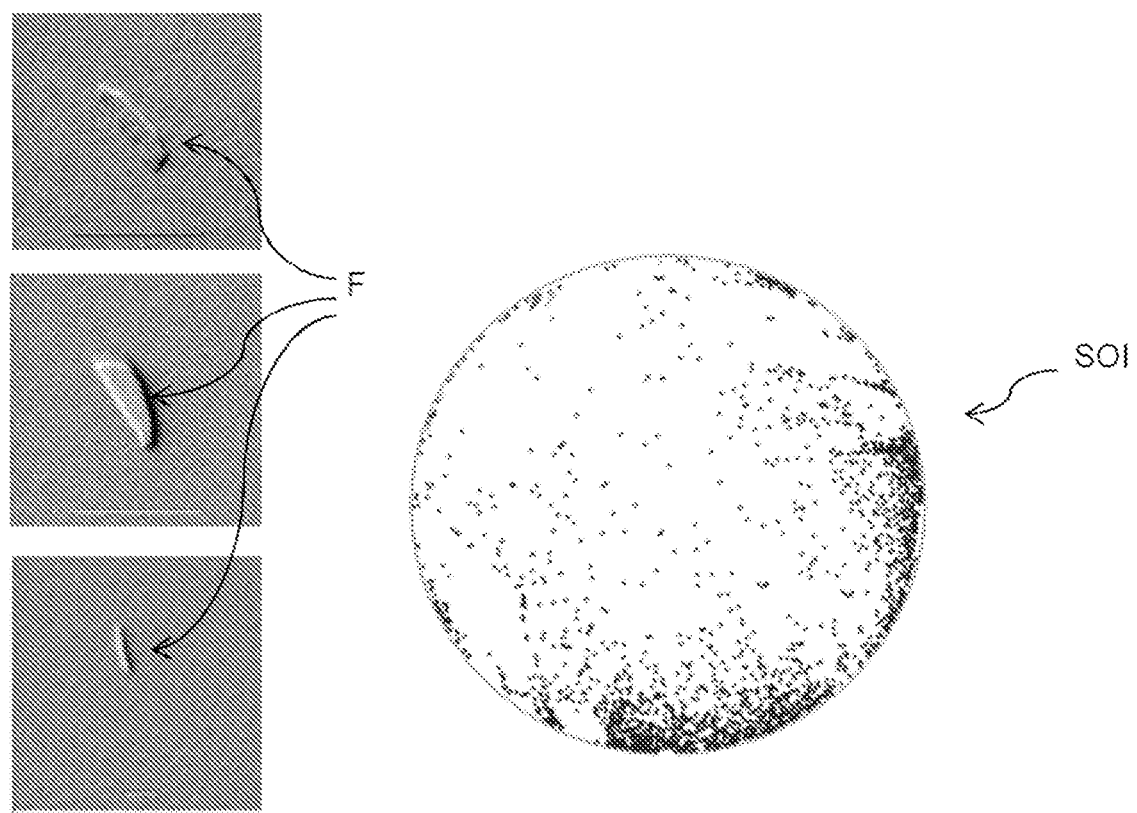
FIG. 3 shows an image of an SOI substrate covered with flake-type defects and scanning-electron-microscope (SEM) micrographs of such defects.
Figure 4:
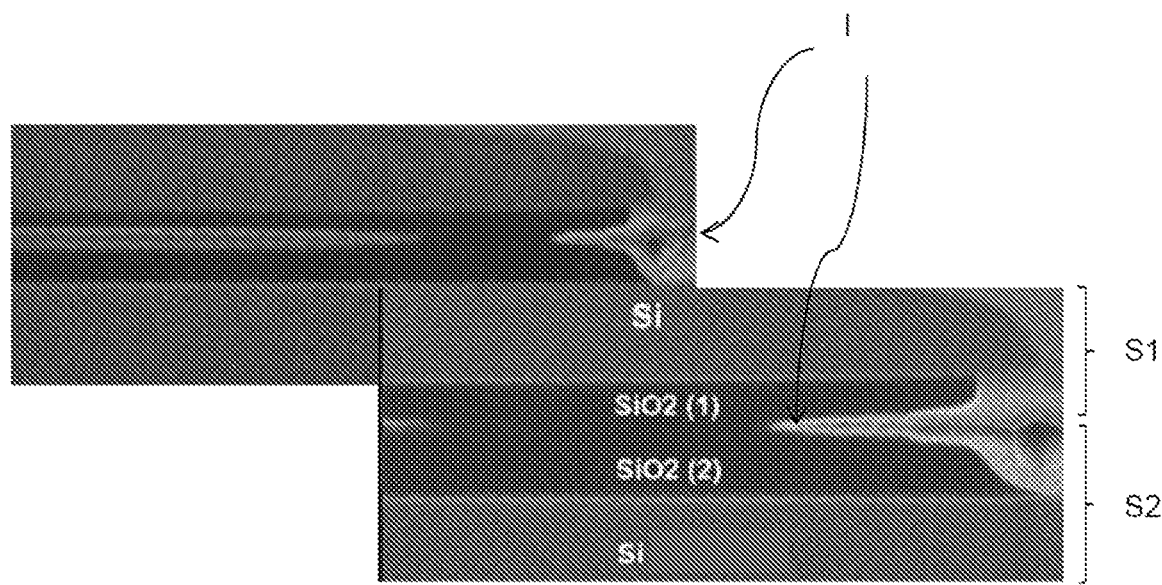
FIG. 4 is a cross-sectional image of an imperfectly closed bonding interface that has undergone preferential chemical etching.
Figure 5A:
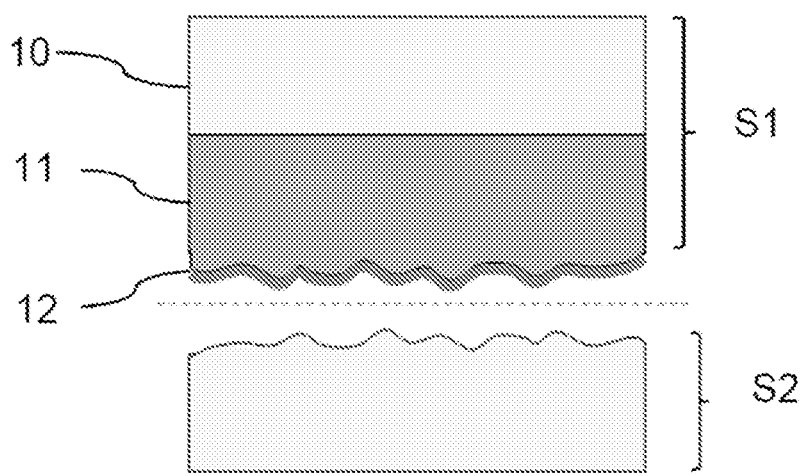
FIG. 5A is a cross-sectional schematic of a step prior to bringing the substrates into contact in a first embodiment of the process according to the present disclosure.
Figure 5B:
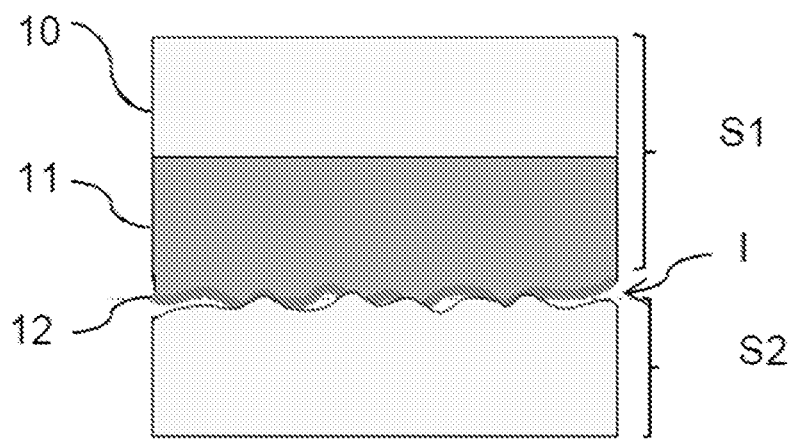
FIG. 5B is a cross-sectional schematic of the substrates of FIG. 5A after they have been brought into contact but before the closure of the bonding interface.
Figure 5C:
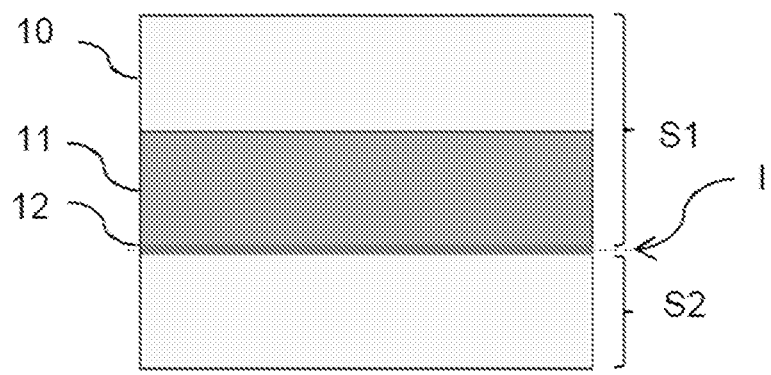
FIG. 5C is a cross-sectional schematic of the substrates of FIG. 5B with the bonding interface closed after the implementation of the heat treatment.

FIGS. 5A to 5C illustrate successive steps of a process according to a first embodiment of the present disclosure.

With reference to FIG. 5A, a first substrate S1 and a second substrate S2 to be bonded along one of their main faces are provided.

According to one embodiment, the first and second substrates are semiconductor substrates, i.e., substrates comprising at least one layer of a semiconductor such as silicon. The substrates may optionally comprise other materials, for example, a layer of an electrical insulator such as silicon oxide ($SiO_2$).

Generally, the present disclosure applies to any substrate compatible with hydrophilic bonding. Certain substrates are naturally hydrophilic; those that are not may undergo a treatment to make their surface hydrophilic, as described below.

Figure 8A:
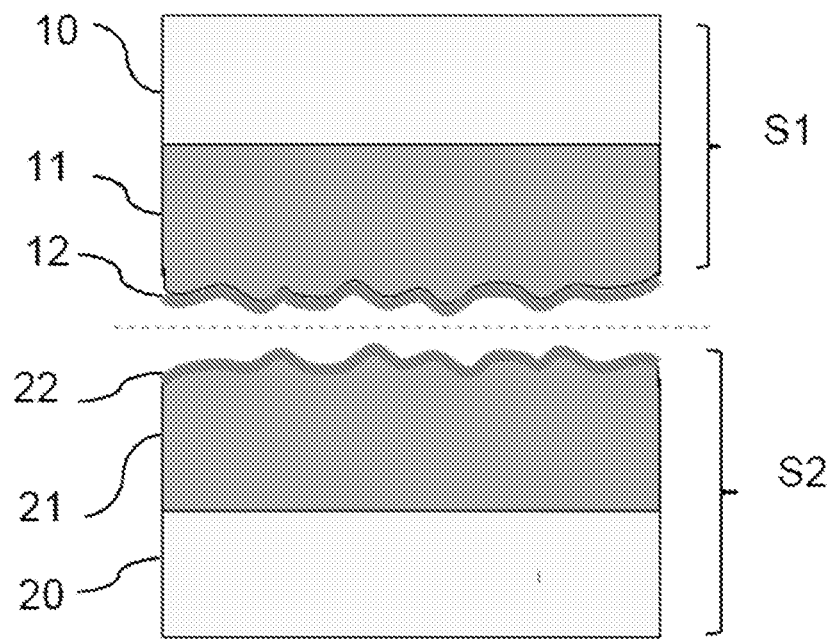
FIG. 8A is a cross-sectional schematic of a step prior to bringing the substrates into contact in a second embodiment of the process according to the present disclosure.
Figure 8B:
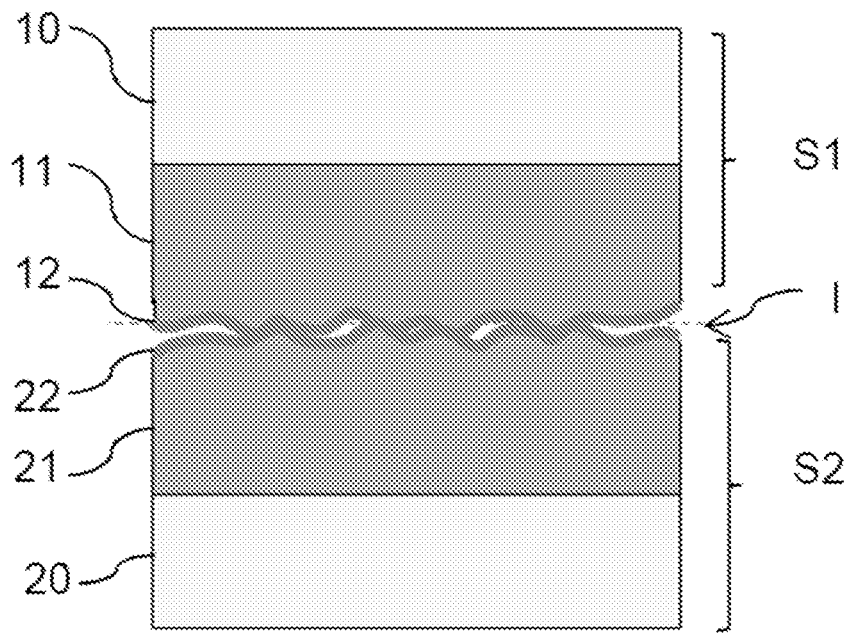
FIG. 8B is a cross-sectional schematic of the substrates of FIG. 8A after they have been brought into contact but before the closure of the bonding interface.
Figure 8C:
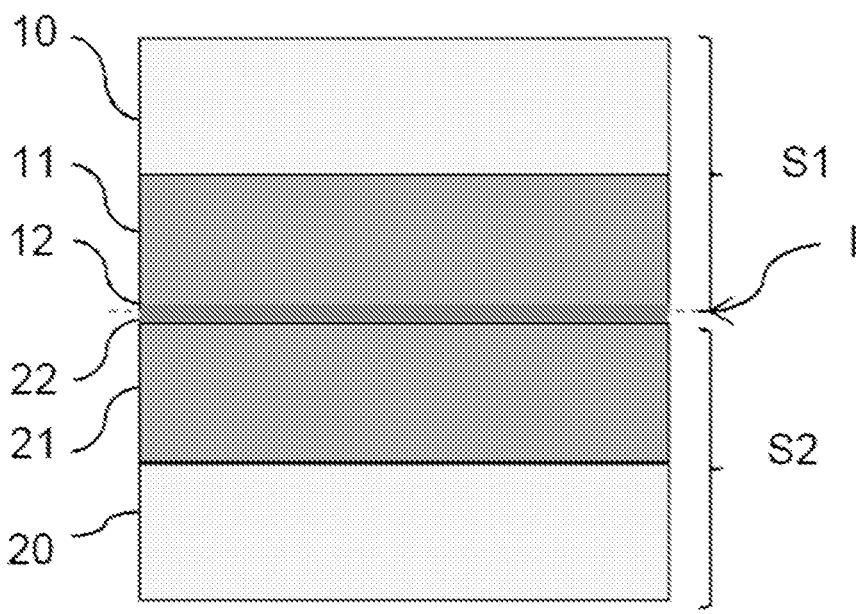
FIG. 8C is a cross-sectional schematic of the substrates of FIG. 8B with the bonding interface closed after the implementation of the heat treatment.

Before the substrates are brought into contact, a layer 12 of a material that has both a low yield strength and a certain permeability to dihydrogen is deposited on one or both of the substrates S1, S2 at low temperature (between 200° C. and 600° C.). In the illustrated example, the bonding layer is deposited on the substrate S1 but, alternatively or in addition, a bonding layer 22 could also be deposited on the substrate S2 as shown in FIGS. 8A-8C.

In practice, the bonding layer is preferably deposited on the substrate the material of which that is present at the bonding interface has the highest yield strength at the temperature at which the heat treatment for closing the interface is implemented. Thus, the negative effect of a material of high yield strength is minimized. For example, in the case of bonding of an oxide and silicon, the bonding layer is preferably deposited on the substrate comprising the oxide layer.

The thickness of the bonding layer is chosen to be sufficiently thin to provide the layer with a certain porosity. The thickness is typically smaller than 10 nm, and preferably between 1 and 6 nm.

According to one advantageous embodiment, especially when the materials present on the main face of the substrates S1, S2 are silicon or silicon oxide, the material of the bonding layer is amorphous silicon or amorphous germanium. Amorphous silicon is, in particular, an advantageous choice for the bonding layer because, at high temperature (typically above 900° C.), amorphous silicon has a yield strength lower than that of crystalline silicon and silicon oxide. Alternatively, amorphous germanium is also suitable for this application because it has a yield strength lower than that of these materials.

In contrast, metals are excluded for the bonding layer, especially because of the drawbacks indicated in the introduction.

FIG. 5B illustrates the substrates S1 and S2 being brought into contact via the bonding layer 12.

Hydrophilic bonding generally requires the faces of the substrates to undergo a hydrophilic treatment, for example, an SC1 clean then rinsing in water. At the end of this step, the surfaces of the substrates are covered with a thin film (about 2 or 3 monolayers) of water bonded to the main face by hydrogen bonds.

Before the implementation of the heat treatment for closing the interface, the main faces of the substrates S1 and S2, although smooth, contain asperities at which the contact between the substrates occurs. Cavities extend between these asperities; hence the interface I is not closed.

FIG. 5C illustrates the structure at the end of the heat treatment for closing the bonding interface. The heat treatment lasts a few hours, preferably about 2 hours, and comprises a relatively slow temperature ramp in order not to damage the substrates. The temperature of the heat treatment may be defined by anyone skilled in the art, for example, on the basis of tests in which the interfaces of a plurality of identical structures treated at different temperatures are closed. The lowest temperature among the temperatures that result in complete closure of the bonding interface is preferably selected.

Under the effect of the temperature and of the mutual attraction of the surfaces making contact, the asperities of the bonding layer become flattened, this leading to removal of the interstitial cavities and to closure of the interface I.

Apart from this mechanical effect, a chemical reaction occurs between the water and the semiconductor present at the bonding interface during the heat treatment, resulting in the release of dihydrogen.

In the case of hydrophilic bonding of oxide and silicon, the chemical reaction is written:

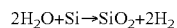

$$2H_2O + Si \rightarrow SiO_2 + 2H_2$$

In other words, the water present at the bonding interface passes through the native oxide present on the silicon and oxidizes the silicon. This effect occurs from 150° C. and leads to the release of dihydrogen, which diffuses into the oxide layer located on the other side of the bonding interface and is stored therein. If the oxide layer is too thin or there is a diffusion barrier between the bonding interface and the oxide layer, the dihydrogen reopens the bonding interface by forming bubbles. In this respect, the publication [Vincent et al] may be referred to.

It could therefore be feared that the bonding layer would form such a barrier and would lead the bonding structure to exhibit a high defect density.

Figure 6A:
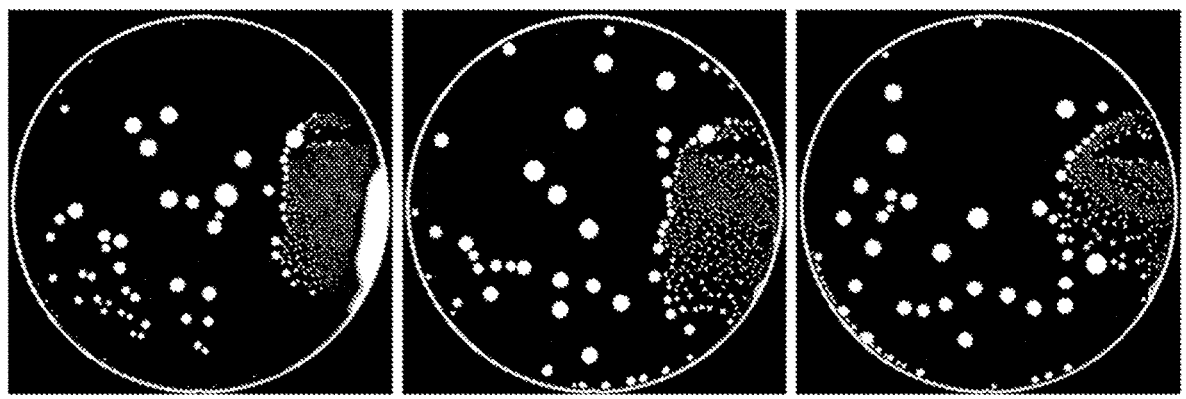
FIG. 6A shows images of views from above of structures bonded with an amorphous-silicon layer the thickness of which is larger than or equal to 8 nm.

FIG. 6A thus shows top view images of the buried oxide layer of structures bonded with an amorphous-silicon layer the thickness of which is larger than or equal to 8 nm, namely, from left to right; 8 nm, 14 nm and 28 nm. The white blotches represent dihydrogen bubbles that have formed at the bonding interface. These three structures may be seen to exhibit a high defect density.

Figure 6B:
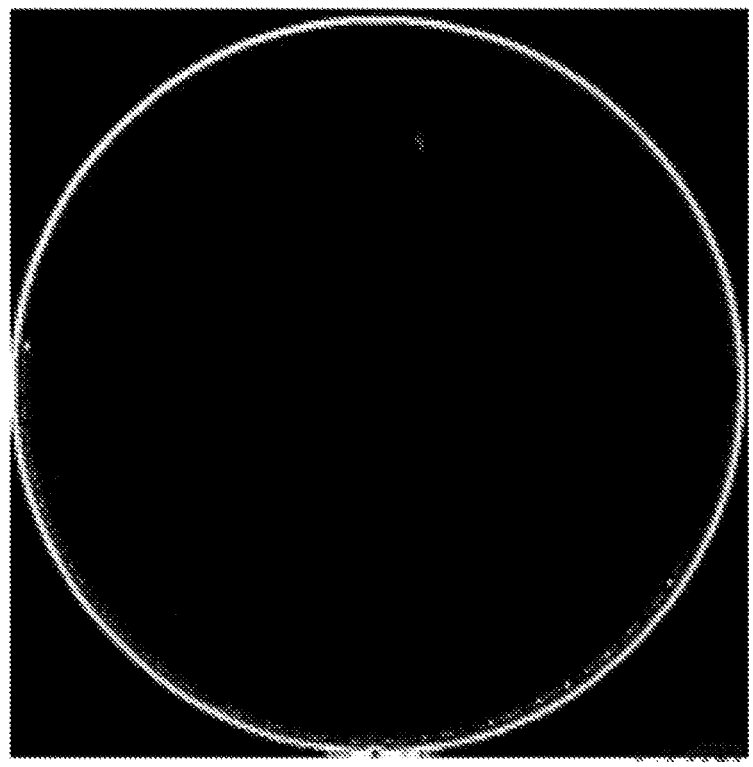
FIG. 6B shows an image of a view from above of a structure bonded with an amorphous-silicon layer the thickness of which is between 2.5 and 6 nm.

In contrast, surprisingly, for a structure bonding with an amorphous-silicon layer having a thickness between 1 and 6 nm, such a high defect density is not generated. FIG. 6B thus shows an image of a top view of the buried oxide layer of a structure bonded with an amorphous-silicon layer the thickness of which is between 2.5 and 6 nm; the absence of the white blotches observed in FIG. 6A shows the absence of dihydrogen bubbles. The amorphous-silicon layer may thus be considered to be sufficiently thin to allow dihydrogen to diffuse to the buried oxide layer, thus ensuring a high-quality bond.

Exemplary Embodiment

According to one particular application of the process described with reference to FIGS. 5A to 5C, the substrate S1 is a silicon substrate 10 covered with a silicon-oxide layer 11. The silicon-oxide layer is preferably formed by thermal oxidation of the silicon. The substrate S2 is a silicon substrate, which typically has a layer of native silicon oxide (not shown) on its surface.

It will be recalled that a layer of native oxide differs from a layer of thermal oxide in its thickness (the layer of native oxide being much thinner than the layer of thermal oxide), and in its stoichiometry. The layer of native oxide is naturally present on the surface of the substrate, and is not intended to perform a particular function. In contrast, the layer of thermal oxide is in general intended to perform an electrical insulation function within the structure obtained by bonding the two substrates. Thus, in the case of an SOI wafer, the layer of thermal oxide is intended to form the buried oxide (BOX) layer of the SOI wafer.

A bonding layer 12 made of amorphous silicon may be deposited as follows.

The substrate surface intended to receive the amorphous-silicon layer is cleaned by way of an oxidizing solution, for example, a solution such as $O_3/HF/O_3$ or $O_3/HF/SC1$.

In order to guarantee the amorphous and smooth character of the amorphous silicon, the substrate is placed in an epitaxial reactor raised to a relatively low temperature. According to one embodiment, the precursor used is disilane $(Si_2H_6)$; the optimal deposition temperature is between 475 and 550° C. The growth rate is then 5 to 10 nm/mn. According to another embodiment, the precursor used is silane $(SiH_4)$; the growth rate is then lower. According to other embodiments, the precursor is a liquid precursor of formula $Si_nH_{2n+2}$ where n is an integer higher than 2, requiring the use of a bubbler; the deposition temperature is then about 425 to 450° C.

Figure 7:
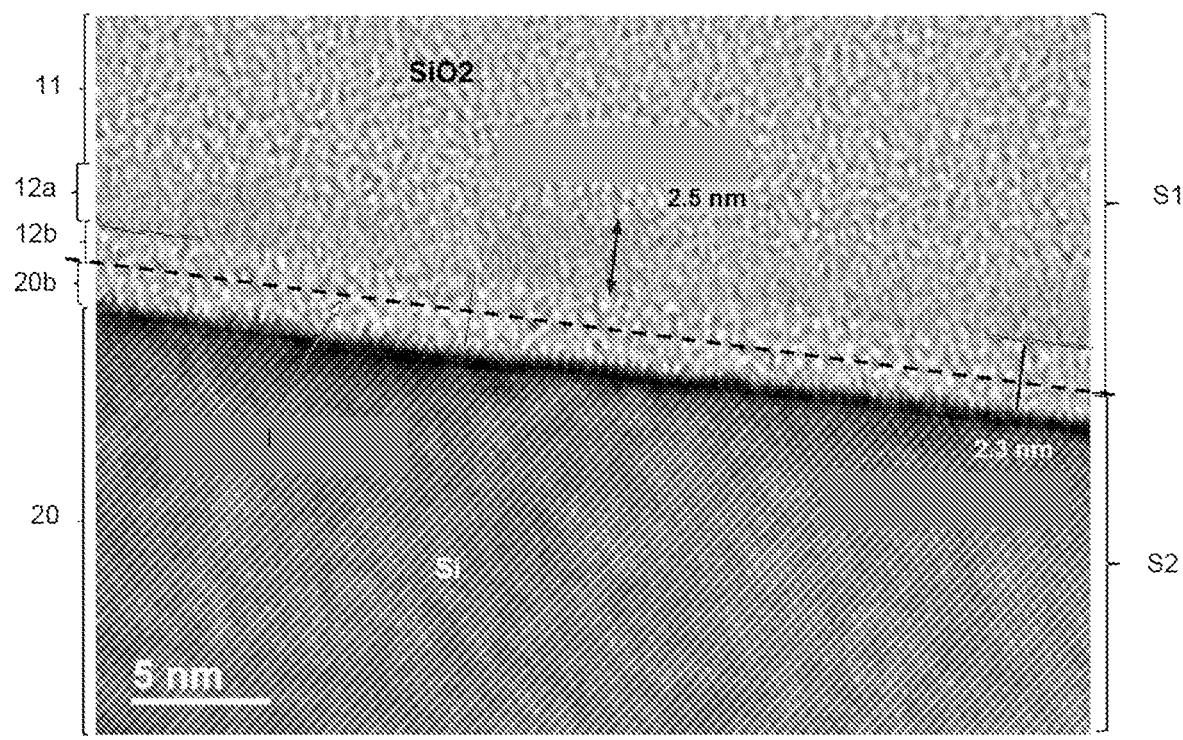
FIG. 7 is a cross-sectional, transmission-electron-microscope (TEM) micrograph of the bonding interface between a silicon substrate and a silicon-oxide layer on which an amorphous-silicon layer of 6 nm thickness has been deposited, after the implementation of a heat treatment at 500° C.

FIG. 7 is a cross-sectional, transmission-electron-microscope (TEM) micrograph of the bonding interface between a substrate S2 comprising a silicon substrate 20 covered with a layer 20b of native silicon oxide and a substrate S1 comprising a silicon substrate (not shown) covered with a silicon-oxide layer 11 on which an amorphous-silicon layer of 6 nm thickness has been deposited, after the implementation of a heat treatment at 500° C.

The amorphous-silicon layer has been partially converted into silicon oxide via reaction with the bonding water on its surface, forming the bonding interface I. The residual portion of amorphous silicon is designated by 12a and the portion of the bonding layer converted into silicon oxide is designated by 12b. This portion 12b is combined with the layer 20b of native silicon oxide of the substrate S2 to form a silicon-oxide layer that extends either side of the bonding interface I.

Advantage may optionally be taken of this effect to convert the entirety of the amorphous-silicon layer into silicon oxide during the heat treatment for closing the bonding interface. To this end, the thickness of the deposited amorphous-silicon layer is chosen to be sufficiently small for the reaction with the bonding water to consume it entirely.

FIGS. 8A to 8C illustrate successive steps of a process according to a second embodiment of the present disclosure.

The steps illustrated in FIGS. 8A to 8C are of the same nature as the steps described with reference to FIGS. 5A to 5C, the difference between the two embodiments of the process being that, in the second embodiment, the bonding layer 12, 22 is deposited on each of the substrates S1 and S2. Steps common to the two processes are therefore not described again.

In the case of FIGS. 8A to 8C, the substrate S1 comprises a layer 10 (for example, of silicon) covered with a silicon-oxide layer 11. Likewise, the substrate S2 comprises a layer 20 (for example, of silicon) covered with a silicon-oxide layer 21. The silicon-oxide layers 11, 21 may be formed by thermal oxidation of the silicon.

It is therefore a question in this case of an oxide-to-oxide bond. Such a bond allows hydrophilic bonding, which is standard in the microelectronics industry, to be used and hence any materials, even if they are incompatible with this type of bonding, to be joined (specifically, it is enough to cover them with a thin oxide layer for them to be bondable hydrophilically). To fabricate an SOI structure, the oxide-to-oxide bond allows a thick buried oxide layer to be obtained or the bonding interface to be encapsulated in oxide when it is liable to interact with the silicon.

Application to the Smart Cut™ Process

Advantageously, but non-limitingly, this bonding process may be used in the Smart Cut™ process to fabricate an SOI structure.

By applying embodiments of the present disclosure, during the implementation of this process, an amorphous-silicon layer is deposited on the oxide layer of the donor substrate (which corresponds to the substrate S1 in FIGS. 5A to 5C) over a thickness of 1 to 6 nm, and the ion implantation that is used to weaken the donor substrate is then carried out.

Since the amorphous silicon has a yield strength lower than that of the silicon and of the silicon oxide, it allows the heat treatment for closing the bonding interface to be carried out at a temperature of about 900° C. for 2 hours, whereas, in the standard Smart Cut™ process, the temperature to be applied to obtain complete closure is 1100° C. for 2 hours, or even 1050° C. for 2 hours if the oxide layer was activated by plasma before the substrates were brought into contact.

Alternatively to the Smart Cut™ process, it is possible to transfer a thin semiconductor layer via another thinning process, such as etching of the donor substrate from its side opposite the bonding interface.

Experimental Results

The closure of the bonding interface may also be evaluated by way of the ratio between the horizontal etch rate (i.e., in the plane of the bonding interface) and the vertical etch rate (i.e., in the direction perpendicular to the bonding interface) of a bonded structure exposed to an etchant solution. When the bonding interface is correctly closed, this ratio is close to 1, this expressing the fact that the etchant solution etches all of the structure uniformly. In contrast, when the bonding interface is not closed, the etchant solution infiltrates into the cavities of the bonding interface, thus etching the interface faster than the rest of the structure. The ratio is then higher than 1.

Figure 9:
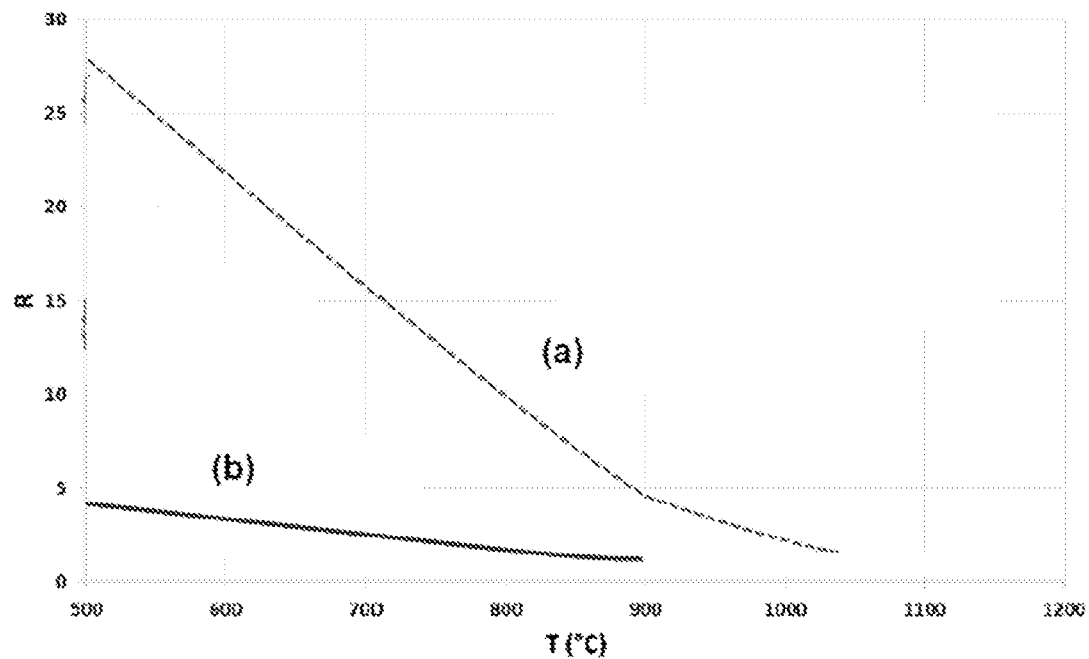
FIG. 9 is a graph showing the (unitless) ratio R between horizontal etch rate and vertical etch rate as a function of the closing temperature T (° C.) of the interface, for a standard bonding process (a) and for a bonding process according to the present disclosure (b).

FIG. 9 illustrates the ratio R as a function of the closing temperature T of the interface, for a standard bonding process (a) and for a bonding process according to the present disclosure (b).

With the standard bonding process, a plurality of structures were formed by hydrophilic bonding of a first substrate comprising a silicon substrate covered with a silicon-oxide layer to a second silicon substrate. The materials present at the bonding interface were therefore the silicon oxide of the first substrate (activated beforehand by plasma) and the silicon of the second substrate. Each bonded structure was subjected to a heat treatment at a different temperature, between 500 and 1050° C. After the heat treatment, each bonded structure was exposed to an etchant solution composed of hydrofluoric (HF) acid diluted to 10% and the etch rate was measured both in the vertical direction and in the horizontal direction.

With the bonding process according to the present disclosure, a plurality of structures were formed by hydrophilic bonding of a first substrate S1 comprising a silicon substrate covered with a silicon-oxide layer on which an amorphous-silicon layer of 1 to 6 nm thickness had been deposited to a second silicon substrate. The materials present at the bonding interface were therefore the amorphous silicon deposited on the first substrate and the silicon of the second substrate. Each bonded structure was subjected to a heat treatment at a different temperature, between 500 and 900° C. After the heat treatment, each bonded structure was exposed to the aforementioned etchant solution and the etch rate was measured both in the vertical direction and in the horizontal direction.

Comparison of curves (a) and (b) shows that, in the case of the standard bonding, the bonding interface is closed (R about equal to 1) only with a heat treatment at 1050° C., any decrease in the temperature of the heat treatment resulting in a significant increase in the ratio R, i.e., in a degradation in the closure of the bonding interface. In contrast, with the bonding process of the present disclosure, the interface is closed from 900° C.; moreover, the slope of curve (b) is much less steep than the slope of curve (a), and hence a decrease in the temperature of the heat treatment has a less detrimental effect on the quality of the closure of the interface. In particular, a temperature of about 600° C. allows an almost complete closure to be obtained.

REFERENCES

[Vincent et al]: A model of interface defect formation in silicon wafer bonding, S. Vincent et al, Applied Physics Letters 94, 101914 (2009)

The invention claimed is:

1. A process for hydrophilic bonding of a first substrate to a second substrate, comprising:
    bringing the first substrate and the second substrate into contact, so as to form a bonding interface between a main surface of the first substrate and a main surface of the second substrate; the second substrate being a silicon substrate covered with a layer of native silicon oxide;
    applying a heat treatment suitable for closing the bonding interface, the heat treatment comprising oxidizing a surface segment of the silicon of the second substrate through the layer of native silicon oxide;
    wherein the process comprises, before the step of bringing into contact, depositing, on the main surface of at least one the first and the second substrate, a bonding layer comprising a non-metallic material that is permeable to dihydrogen and that has, at a temperature of the heat treatment, a yield strength lower than a yield strength of at least one of a material of the first substrate and a material of the second substrate located at the bonding interface, the bonding layer having a thickness between 1 and 6 nm; and
    wherein the temperature of the heat treatment is lower than or equal to 900° C.

2. The process of claim 1, wherein the first substrate comprises a silicon-oxide surface layer other than a native oxide, and the bonding layer is deposited on the silicon-oxide surface layer.

3. The process of claim 2, wherein the silicon-oxide surface layer is formed by thermal oxidation of the first substrate.

4. The process of claim 1, further comprising, after the application of the heat treatment for closing the bonding interface, a step of thinning the first substrate so as to transfer a thin layer of the first substrate to the second substrate.

5. The process of claim 4, further comprising, between the deposition of the bonding layer and the step of bringing the first substrate and the second substrate into contact, forming a silicon-oxide surface layer on the first substrate and implanting ionic species in the first substrate through the silicon-oxide surface layer so as to form a weakened region delineating a semiconductor layer to be transferred.

6. The process of claim 1, further comprising, between the deposition of the bonding layer and the step of bringing the first and second substrates into contact, implementing a hydrophilic treatment of the main surface of the substrates that includes applying water to the main surface of the substrates in order to form a film of water on the main surface.

7. The process of claim 1, further comprising, before the deposition of the bonding layer, a step of cleaning the main surface on which the bonding layer is to be deposited with an oxidizing solution.

8. The process of claim 1, wherein the non-metallic material of the bonding layer is chosen from amorphous silicon and amorphous germanium.

9. The process of claim 8, wherein the non-metallic material of the bonding layer is amorphous silicon and the amorphous-silicon layer is formed in an epitaxial reactor at a temperature below 550° C.

10. The process of claim 9, wherein the amorphous-silicon layer is formed from a precursor chosen from: disilane ($Si_2H_6$), silane ($SiH_4$) or a liquid precursor of formula $Si_nH_{2n+2}$, where n is an integer higher than 2.

11. The process of claim 1, wherein the temperature of the heat treatment is lower than or equal to 600° C.

12. The process of claim 1, further comprising, after the application of the heat treatment for closing the bonding interface, a step of thinning the first substrate so as to transfer a thin layer of the first substrate to the second substrate.

13. The process of claim 1, further comprising, between the deposition of the bonding layer and the step of bringing the first and second substrates into contact, implementing a hydrophilic treatment of the main surface of the substrates that includes applying water to the main surface of the substrates in order to form a film of water on the main surface.

14. The process of claim 1, further comprising, before the deposition of the bonding layer, a step of cleaning the main surface on which the bonding layer is to be deposited with an oxidizing solution.

15. The process of claim 1, wherein the non-metallic material of the bonding layer is chosen from amorphous silicon and amorphous germanium.

\* \* \* \* \*